United States Patent [19]

Morisaki

[11] Patent Number: 5,561,423
[45] Date of Patent: Oct. 1, 1996

[54] SERIAL TO PARALLEL CONVERSION CIRCUIT

[75] Inventor: Shigeki Morisaki, Tokyo, Japan

[73] Assignee: NEC Corporation, Tokyo, Japan

[21] Appl. No.: 260,820

[22] Filed: Jun. 16, 1994

[30] Foreign Application Priority Data

Jun. 16, 1993 [JP] Japan .................................. 5-145050

[51] Int. Cl.⁶ ...................................................... H03M 9/00
[52] U.S. Cl. ............................................. 341/100; 377/47
[58] Field of Search ..................................... 341/100, 101; 377/47

[56] References Cited

U.S. PATENT DOCUMENTS

| | | | |
|---|---|---|---|
| 5,155,487 | 10/1992 | Tanaka et al. | 341/100 |
| 5,223,833 | 6/1993 | Akata | 341/100 |

*Primary Examiner*—Marc S. Hoff
*Attorney, Agent, or Firm*—Sughrue, Mion, Zinn, Macpeak & Seas

[57] ABSTRACT

The invention realizes a serial to parallel conversion circuit which operates at a high speed with low power dissipation. High speed serial data are input and re-timed with a high speed clock input by a first high speed flip-flop. Differential divide-by-eight clock signals are produced by dividing the high speed differential clock input by two using a second high speed flip-flop and are supplied to ninth through eleventh flip-flops, by which divide-by-eight shift clock signals and another series of divide-by-eight shift clocks leading the divide-by-two clocks by a half-period are produced. The output of the first high speed flip-flop is input to a shift register comprising first through fourth flip-flops, and is shifted with the positive phase divide-by-two clock signals. The output of the shift register is then re-timed with the other divide-by-eight shift clock signals described above by twelfth through fifteenth flip-flops. Similarly, the output of the first high speed flip-flop is shifted with the negative phase two-division clocks by fifth through eighth flip-flops and is re-timed with the divide-by-eight clocks by sixteenth through nineteenth flip-flops. The outputs of the twelfth through nineteenth flip-flops serve as outputs of the serial to parallel conversion circuit.

3 Claims, 6 Drawing Sheets

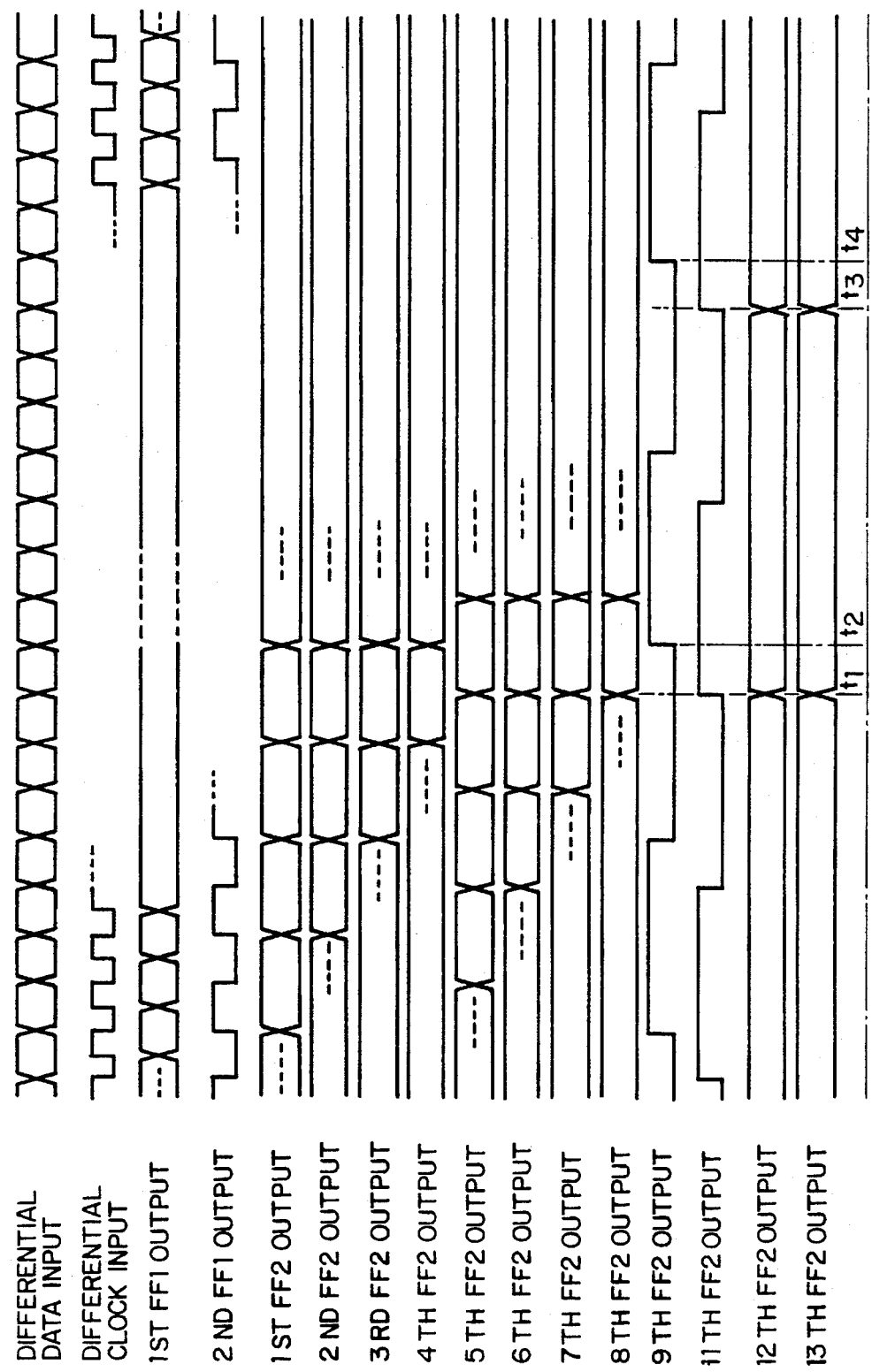

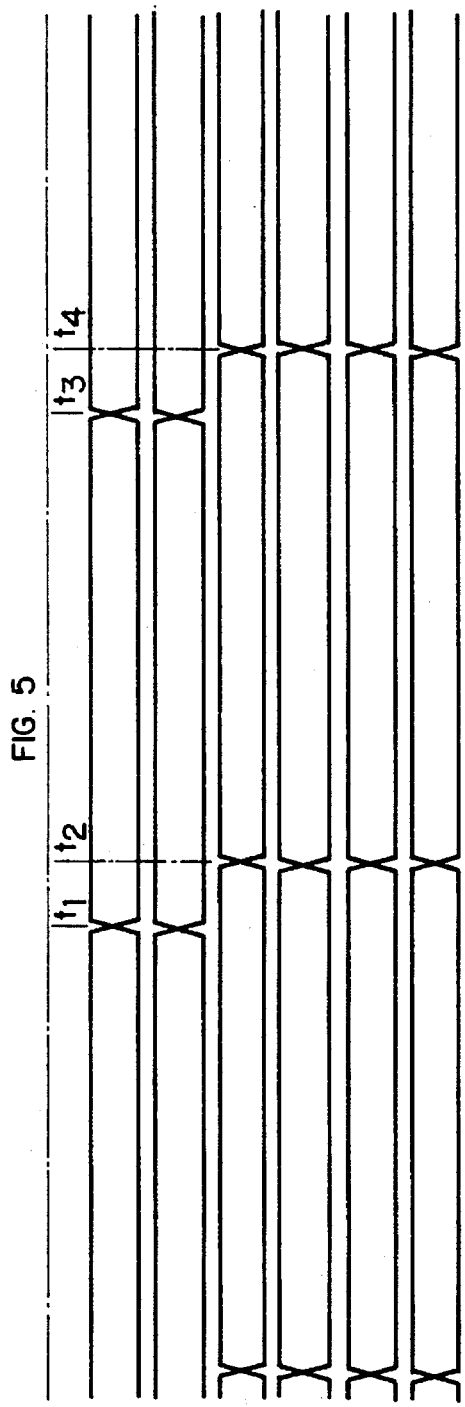

SERIAL TO PARALLEL CONVERSION CIRCUIT

BACKGROUND OF THE INVENTION

1. Field of the Invention

This invention relates to a serial to parallel conversion circuit, and more particularly to a serial to parallel conversion circuit for which high speed operation is required.

2. Description of the Related Art

FIG. 1 is a circuit diagram showing the construction of a conventional example of a serial to parallel conversion circuit of the type mentioned, and FIGS. 2 and 3 are signal timing charts illustrating operation of the conventional example of FIG. 1.

In the present conventional example, the serial to parallel conversion circuit includes 10 high speed flip-flops of the same configuration and 10 medium speed flip-flops of the same configuration. In the following description, the former flip-flops are referred to as FF1, and the latter flip-flops are referred to as FF2. Each of flip-flops FF1 has positive phase signal input and output terminals and negative phase signal input and output terminals for inputting and outputting differential signals, respectively, and differential clock input terminals for inputting differential clocks, and performs the same logic operation as a D-type flip-flop. Each of flip-flops FF2 is also formed as a D-type flip-flop. The connection wherein the positive phase side one of differential signals is connected to the positive phase input terminal side of a flip-flop and the negative phase side one of the differential signals is connected to the negative phase input terminal side of the flip-flop is hereinafter referred to as a positive phase connection, but the other connection wherein the positive sides and the negative sides are connected in a crossing relationship is hereinafter referred to as a negative phase connection.

First flip-flop FF1 3 is connected in positive phase connection with the signal input terminals thereof connected to differential data input terminals 1 and with the clock input terminals thereof connected to differential clock input terminals 2. Second flip-flop FF1 4 is connected in negative phase connection at the differential signal output terminals and the differential signal input terminals thereof and with the clock input terminals thereof connected in positive phase connection to differential clock input terminals 2 thereby to construct a known divide-by-two circuit, which outputs two-division signals of the inputted differential clocks. Eight flip-flops FF1 from third flip-flop FF1 5 to tenth flip-flop FF1 12 are connected so that the positive phase signal output terminal of each of them is connected in a cascade connection to the positive phase signal input terminal of the flip-flop FF1 at the next stage, while the clock input terminals of all of them are connected in a positive phase connection to differential clock input terminals 2, thereby forming an 8-bit shift register. The positive phase signal input terminal of third flip-flop FF1 5 is connected to the positive phase signal output terminal of first flip-flop FF1 3. It is to be noted that, though not shown in the block diagram of FIG. 1, the negative phase signal input terminals of the eight FF1 flip-flops from third flip-flop FF1 5 to tenth flip-flop FF1 12 are connected to a reference level (the voltage midpoint between high and low logical levels). Ninth flip-flop FF2 21 and tenth flip-flop FF2 22 form a known divide-by-four circuit, and the Q signal output terminal of ninth flip-flop FF2 21 is connected to the signal input terminal of tenth flip-flop FF2 22 while the $\overline{Q}$ signal output terminal of tenth flip-flop FF2 22 is connected to the signal input terminal of ninth flip-flop FF2 21. The negative phase signal output of second flip-flop FF1 4 is input as a clock signal to the clock input terminals of ninth flip-flop FF2 21 and tenth flip-flop FF2 22, and a clock signal of a frequency obtained by dividing differential clocks input from differential clock input terminals 2 by eight is output from the Q signal output terminal of ninth flip-flop FF2 21. Twelfth to nineteenth flip-flops FF2 24 to FF2 31 are connected at the signal input terminals thereof to the positive phase signal output terminals of flip-flops FF1 5 to FF1 12 forming the stages of the shift register described above, respectively, and connected at the Q signal output terminals thereof to output terminals 39, 38, 37, 36, 35, 34, 33 and 32, respectively, in order. The divide-by-eight positive phase signal described above is connected to the clock input terminals of all flip-flops FF2 24 to FF2 31.

Operation of the present conventional example is described below with reference to the drawings.

As shown in FIG. 2, high speed 8-bit serial signals $D_1^n$ - $D_8^n$ (n represents the input order number of data in units of 8 bits) input from differential data input terminals 1 are input to the differential signal input terminals of first flip-flop FF1 3. First flip-flop FF1 3 re-times and shapes the input signals with high speed differential clocks input from differential clock input terminals 2 and successively outputs the shaped signals from the positive phase signal output terminal thereof to the shift register at the next stage. FIG. 2 illustrates a situation wherein the bit signals are successively shifted in flip-flops FF1 3, 5 to 12 in the shift register in response to the timings of differential clocks. Second flip-flop FF1 4 outputs a negative phase two-division signal from the negative phase signal output terminal, and ninth and tenth flip-flops FF2 21 and 22 further divide the negative phase two-division signal by four to obtain divide-by-eight clocks and inputs the divide-by-eight clocks to the clock terminals of twelfth to nineteenth flip-flops FF2 24 to FF2 31. Time difference d between the negative phase signal and the divide-by-eight signal shown in FIG. 2 represents the propagation delay time of ninth medium speed flip-flop FF2 21. Accordingly, bit signals $D_1^n$ - $D_8^n$ of a series of an 8-bit serial signal, which are the outputs of each stage of the shift register, are read out at a time from twelfth to nineteenth flip-flops FF2 24 to FF2 31 at the timing of an divide-by-eight clock output from ninth flip-flop FF2 21 and are output as an 8-bit parallel signal from output terminals 32 to 39.

In the serial to parallel conversion circuit of the conventional example described above, ten high speed flip-flops FF1 are used. When making a flip-flop circuit by a CMOS process is attempted in order to achieve such a high speed operation as described above, flip-flops must be constructed using gates of the NMOS type. However, an NMOS type gate employs an active load, and consequently, electric current always flows through the gate. In order to achieve a higher speed operation, the value of the electric current must be increased, and consequently, the flip-flop circuit which employs the gates of the NMOS type exhibits very high power dissipation when compared with flip-flop circuits of the CMOS type. Accordingly, the serial to parallel conversion circuit of the conventional example described above is disadvantageous in that, since the power dissipation of the entire serial to parallel conversion circuit becomes excessively high, in order to form the serial to parallel conversion circuit into a single chip together with other large scale logic circuits, huge heat radiation fins or special water-cooling mounting parts are required or it is impossible to form the serial to parallel conversion circuit into a single chip.

SUMMARY OF THE INVENTION

It is an object of the present invention to provide a serial to parallel conversion circuit wherein the number of flip-flops used in a high-speed operation having high power dissipation is reduced while flip-flops of a medium-speed operation having low power dissipation are utilized instead in order to achieve high speed operation and low power dissipation concurrently.

According to the present invention, a serial to parallel conversion circuit comprises:

a first high speed flip-flop having a pair of differential signal input terminals and a pair of differential clock input terminals connected in positive phase connection to a pair of differential data input terminals and a pair of differential clock input terminals of the serial to parallel conversion circuit, respectively;

a divide-by-two circuit including a second high speed flip-flop having a pair of differential signal input terminals and a pair of differential clock input terminals connected in negative phase connection to a pair of differential signal output terminals thereof and the differential clock input terminals of the serial to parallel conversion circuit, respectively;

a pair of shift registers including four-stage cascade connection constructions of four (first through fourth) medium speed flip-flops and four (fifth through eighth) medium speed flip-flops each connected so that a signal input terminal of the medium speed flip-flop at the first stage is connected to a positive phase signal output terminal of the first high speed flip-flop; a Q signal output terminal of the medium speed flip-flop at each stage is connected to a signal input terminal of the medium speed flip-flop at the next stage; and all of clock input terminals of the first through fourth medium speed flip-flops and all of clock input terminals of the fifth through eighth medium speed flip-flops are connected to the positive phase signal output terminal and the negative phase signal output terminal of the second high speed flip-flop, respectively;

a divde-by-four circuit including ninth and tenth medium speed flip-flops connected so that a signal input terminal and a Q signal output terminal of the ninth medium speed flip-flop are connected to a $\overline{Q}$ signal output terminal and a signal input terminal of the tenth medium speed flip-flop, respectively, and clock input terminals of the ninth and tenth medium speed flip-flops are both connected to the positive phase signal output terminal of the second high speed flip-flop;

an eleventh medium speed flip-flop having a signal input terminal connected to the $\overline{Q}$ signal output terminal of the tenth medium speed flip-flop and having a clock input terminal connected to the negative phase signal output terminal of the second high speed flip-flop; and twelfth to fifteenth medium speed flip-flops having signal input terminals connected to the Q signal output terminals of the first through fourth medium speed flip-flops, respectively, and having clock input terminals connected to a Q signal output terminal of the eleventh medium speed flip-flop, and sixteenth to nineteenth medium speed flip-flops having signal input terminals connected to the Q signal output terminals of the fifth through eighth medium speed flip-flops, respectively, and having clock input terminals connected to the Q signal output terminal of the ninth medium speed flip-flop;

Q signal output terminals of the twelfth to nineteenth medium speed flip-flops being connected to respective parallel signal output terminals of the serial to parallel conversion circuit.

Each of the flip-flops performs a logical operation of a D-type flip-flop.

Due to the construction described above, with the serial to parallel conversion circuit of the present invention, the number of flip-flops used in a high speed operation having high power dissipation is reduced from ten to two when compared with that of the conventional example described hereinabove, replacing some of the flip-flops with medium speed operation flip-flops of the low power dissipation type. Accordingly, a serial to parallel conversion circuit which operates at a high speed with low power dissipation is realized.

BRIEF DESCRIPTION OF THE DRAWINGS

FIG. 5 is a timing chart illustrating operation of the embodiment of FIG. 4; and FIG. 6 is a timing chart illustrating, in connection with FIG. 5, operation of the embodiment of FIG. 4.

DETAILED DESCRIPTION OF THE PREFERRED EMBODIMENT

An embodiment of the present invention is described below with reference to the drawings.

Figure 4:
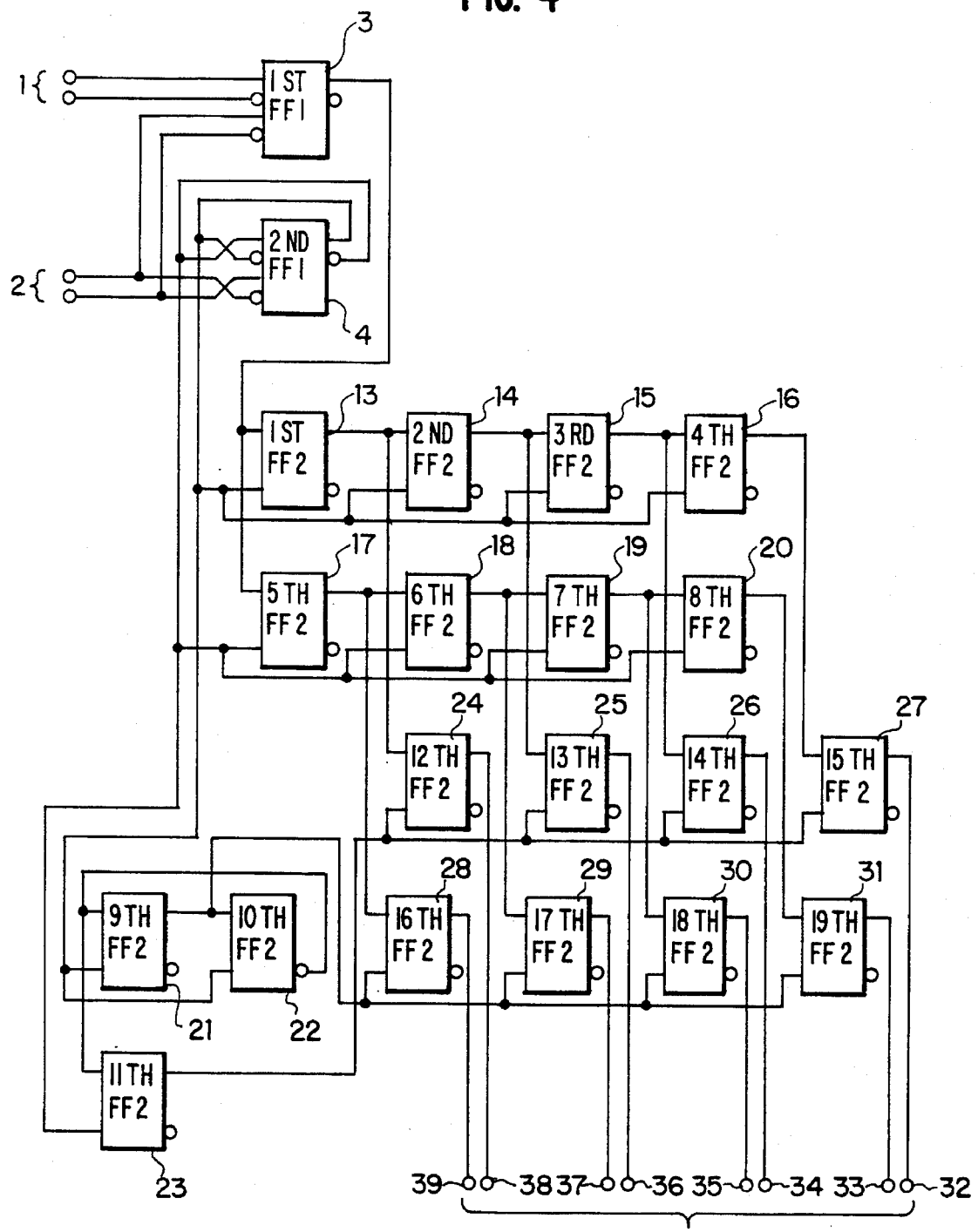
FIG. 4 is a circuit diagram of an embodiment of a serial to parallel conversion circuit of the present invention.

FIG. 4 is a circuit diagram of an embodiment of a serial to parallel conversion circuit of the present invention, and FIGS. 5 and 6 are timing charts illustrating operation of the present embodiment.

Figure 1:
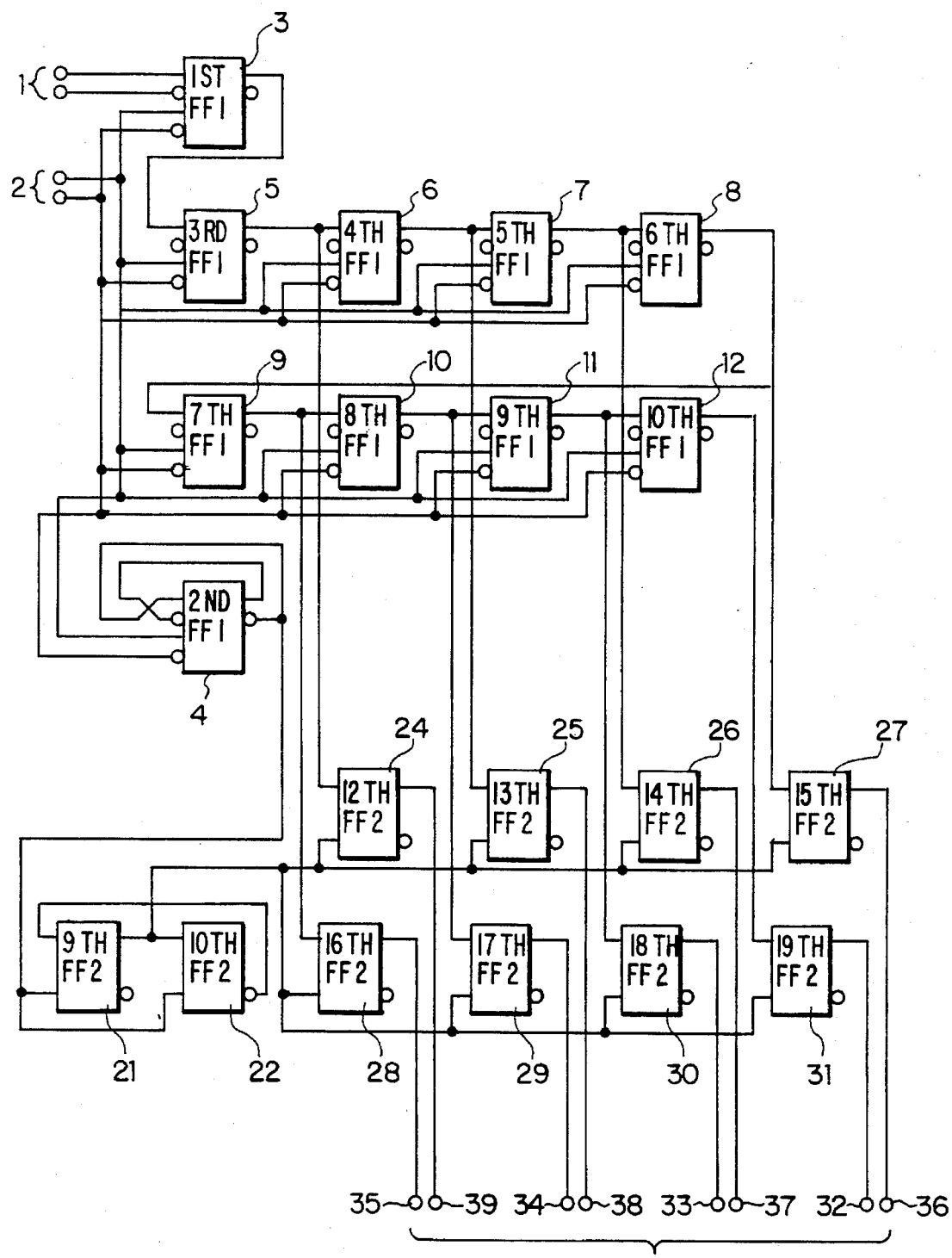
FIG. 1 is a circuit diagram of a conventional example of a serial to parallel conversion circuit.
Figure 2:
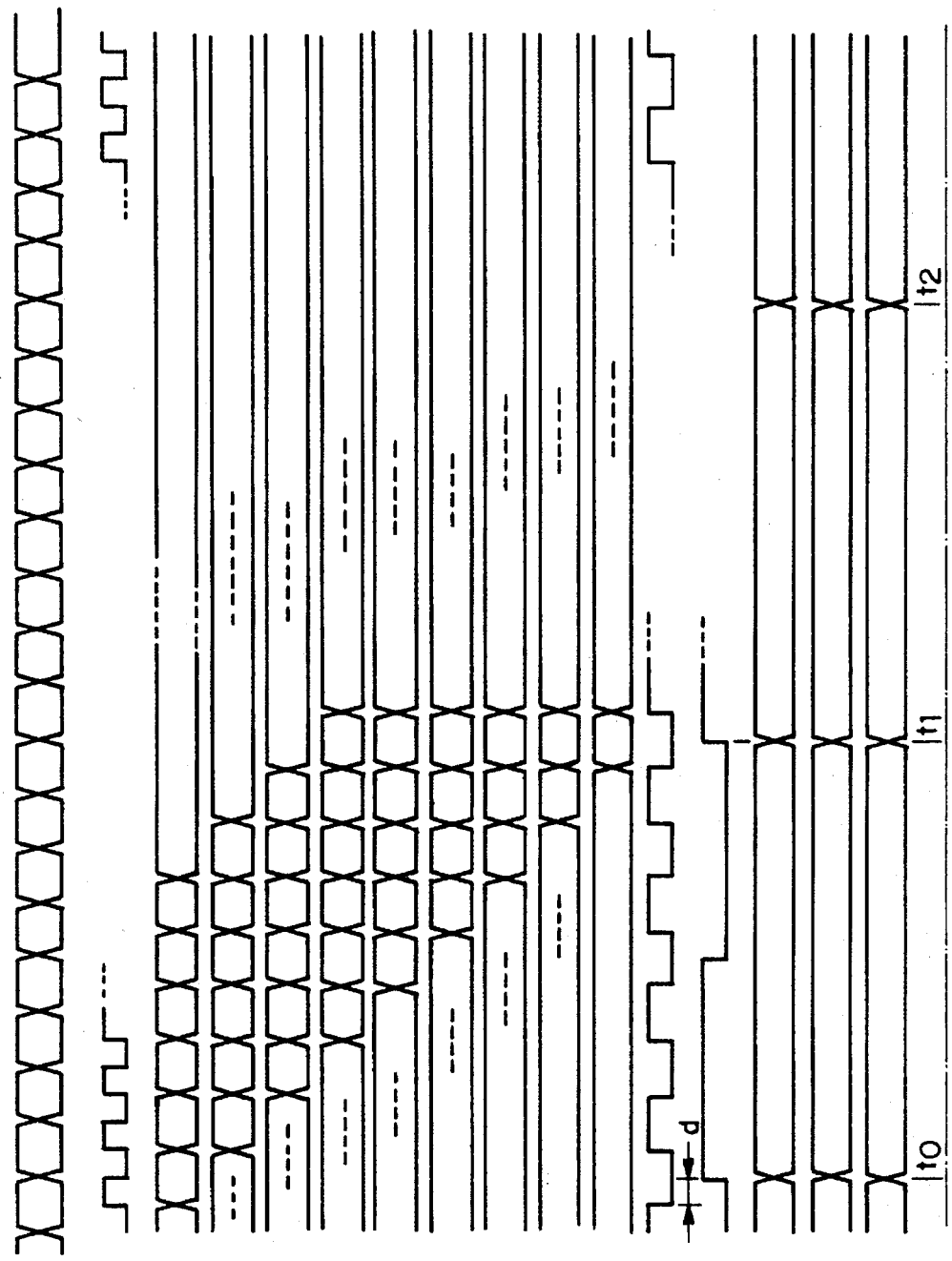
FIG. 2 is a timing chart illustrating operation of the conventional example of FIG. 1.
Figure 3:
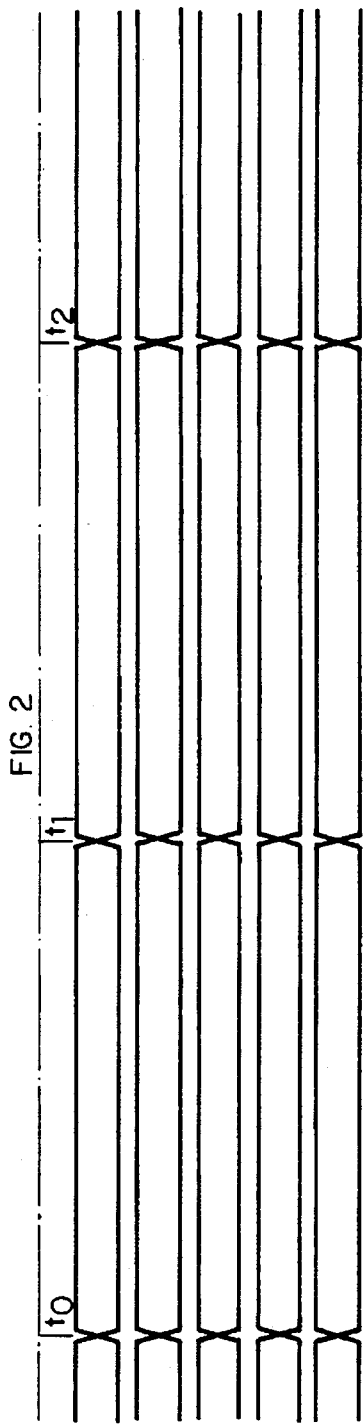
FIG. 3 is a timing chart illustrating, in connection with FIG. 2, operation of the conventional example of FIG. 1.

The present embodiment includes two high speed flip-flops (FF1) and nineteen medium speed flip-flops (FF2), which are similar to those of the conventional example of FIG. 1.

First flip-flop FF1 3 is connected at the differential signal input terminals and the differential clock input terminals thereof in positive phase connection to differential data input terminals 1 and differential clock input terminals 2 of the serial to parallel conversion circuit, respectively. Second flip-flop FF1 4 is connected at the differential signal input terminals and the differential clock input terminals thereof in negative phase connection to the differential signal output terminals thereof and differential clock input terminals 2, respectively, thereby constructing a known divide-by-two. First to fourth flip-flops FF2 13 to FF2 16 and fifth to eighth flip-flops FF2 17 to FF2 20 are individually connected in cascade connection, thereby forming two 4-bit shift registers. The signal input terminals of first and fifth flip-flops FF2 13 and FF2 17 at the first stages of the shift registers are both connected to the positive phase signal output terminals of first flip-flop FF1 3. The Q signal output terminals of flip-flop FF2 at each stage are connected to the signal input terminals of flip-flop FF2 at the next stage. All of the clock input terminals of first to fourth flip-flops FF2 13 to FF2 16 and all of the clock input terminals of fifth to eighth flip-flops FF2 17 to FF2 20 are connected to the positive phase signal output terminal and the negative phase signal output terminal of second flip-flop FF1 4, respectively. Ninth flip-flop FF2 21 and tenth flip-flop FF2 22 are divide-by-four circuits similar to those of the conventional example described hereinabove and are connected at the clock input terminals thereof to the positive phase signal output terminal of second flip-flop FF1 4. Eleventh flip-flop FF2 23 is connected at the signal input terminal thereof to the $\overline{Q}$ signal output terminal of tenth flip-flop FF2 22 and is also connected at the clock input terminal thereof to the negative phase signal output terminal of second flip-flop FF1 4. Twelfth to fifteenth flip-flops FF2 24 to 27 are connected at the signal input terminals thereof to the Q signal output terminals of first to fourth flip-flops FF2 13 to 16 at the stages of the shift register, respectively, and are also connected at the clock input terminals thereof to the Q signal output terminal of eleventh flip-flop FF2 23. Sixteenth to nineteenth flip-flops FF2 28 to 31 are connected at the signal input terminals thereof to the Q signal output terminals of fifth to eighth flip-flops FF2 17 to 20 of the stages of the shift register, respectively, and are also connected at the clock input terminals thereof to the Q signal output terminal (output terminal of the divide-by-four circuit) of ninth flip-flop FF2 21. The Q signal output terminals of fifteenth, nineteenth, fourteenth, eighteenth, thirteenth, seventeenth, twelfth and sixteenth flip-flops FF2 are connected to output terminals 32, 33, 34, 35, 36, 37, 38 and 39 of the serial to parallel conversion circuit, respectively.

Operation of the present embodiment is described below with reference to the drawings.

As shown in FIG. 4, high speed 8-bit serial signals $D_1^n$ $D_8^n$ (n represents the input order number of data in units of 8 bits) are input from differential data input terminals 1 to the differential signal input terminals of first flip-flop FF1 3. First flip-flop FF1 3 re-times and shapes the input signals with high speed differential clocks input from differential clock input terminals 2 and successively inputs the shaped signals from the positive phase signal output terminal thereof to the two shift registers at the next stage. FIG. 5 illustrates a situation wherein the bit signals are successively shifted in flip-flops FF2 13 to FF2 16 and FF2 17 to FF2 20 in the shift registers in response to the timings of differential clocks input from second flip-flop FF1 of the divided-by-two circuit. Ninth flip-flop FF2 21 inputs a positive phase divided-by-two signal from the positive phase signal output terminal of second flip-flop FF1 4 and cooperates with tenth flip-flop FF2 22 to further divide the input positive phase divide-by-two signal by four to obtain divide-by-eight clocks. The divide-by-eight clocks thus obtained are input to the clock terminals of sixteenth to nineteenth flip-flops FF2 28 to 31. Meanwhile, eleventh flip-flop FF2 23 reads out the $\overline{Q}$ signal input from tenth flip-flop FF2 22 in response to the clocks of the negative phase output signal input to the clock terminal thereof from second flip-flop FF1 4 and also inputs the read-out signal to the clock terminals of twelfth to fifteenth flip-flops FF2 24 to 27. Accordingly, as shown in FIGS. 5 and 6, the data are output from output terminals 33, 35, 37 and 39 after a delay of time equal to one half a divide-by-two clock for the data output from output terminals 32, 34, 36 and 38,: Accordingly a desired 8-bit parallel signal can be extracted within a period from time t2 to time t3.

As described above in connection with the embodiment of the present invention, the present invention makes it possible to realize a serial to parallel conversion circuit of the high speed operation and low power dissipation type by contriving the circuit configuration so that the number of flip- flops of the high speed operation and high power dissipation type is reduced by replacing some of them with flip-flops of the medium speed operation and lower power dissipation type. Accordingly, there is an advantage in that, even if the serial to parallel conversion circuit is formed into a single chip together with other large scale logic circuits, the power dissipation of the entire circuit can be suppressed. Although a certain preferred embodiment of the present invention has been shown and described in detail, it should be understood that various changes and modifications may be made therein without departing from the scope of the appended claims.

What is claimed is:

1. A serial to parallel conversion circuit, comprising:

a first high speed flip-flop having a pair of differential signal input terminals and a pair of differential clock input terminals connected in positive phase connection to a pair of differential data input terminals and a pair of differential clock input terminals of said serial to parallel conversion circuit, respectively;

a divide-by-two circuit including a second high speed flip-flop having a pair of differential signal input terminals and a pair of differential clock input terminals connected in negative phase connection to a pair of differential signal output terminals therefrom and said differential clock input terminals of said serial to parallel conversion circuit, respectively;

a pair of shift registers having four-stage cascade connection constructions of first through fourth medium speed flip-flops and fifth through eighth medium speed flip-flops, respectively, with each cascade of flip-flops connected so that a signal input terminal of the medium speed flip-flop at the first stage is connected to a positive phase signal output terminal of said first high speed flip-flop, wherein a Q signal output terminal of the medium speed flip-flop at each stage is connected to a signal input terminal of the medium speed flip-flop at the next stage, and wherein the clock input terminals of said first through fourth medium speed flip-flops and the clock input terminals of said fifth through eighth medium speed flip-flops are connected to the positive phase signal output terminal and the negative phase signal output terminal of said second high speed flip-flop, respectively;

a divide-by-four circuit including ninth and tenth medium speed flip-flops connected so that a signal input terminal and a Q signal output terminal of said ninth medium speed flip-flop are connected to a $\overline{Q}$ signal output terminal and a signal input terminal of said tenth medium speed flip-flop, respectively, and clock input terminals of said ninth and tenth medium speed flip-flops are both connected to the positive phase signal output terminal of said second high speed flip-flop;

an eleventh medium speed flip-flop having a signal input terminal connected to the $\overline{Q}$ signal output terminal of said tenth medium speed flip-flop and having a clock input terminal connected to the negative phase signal output terminal of said second high speed flip-flop; and twelfth through fifteenth medium speed flip-flops having signal input terminals connected to the Q signal output terminals of said first through fourth medium speed flip-flops, respectively, and having clock input terminals connected to a Q signal output terminal of said eleventh medium speed flip-flop;

sixteenth through nineteenth medium speed flip-flops having signal input terminals connected to the Q signal output terminals of said fifth through eighth medium speed flip-flops, respectively, and having clock input terminals connected to the Q signal output terminal of said ninth medium speed flip-flop, wherein Q signal output terminals of said twelfth through nineteenth medium speed flip-flops are connected to respective parallel signal output terminals of said serial to parallel conversion circuit.

2. A serial to parallel conversion circuit as claimed in claim 1, wherein each of the high speed flip-flops has a gate of the NMOS type and an active load and performs the same logical operation as a D-type flip-flop.

3. A serial to parallel conversion circuit as claimed in claim 1, wherein each of the medium speed flip-flops is a D-type flip-flop.

* * * * *